United States Patent
Aftelak

(10) Patent No.: US 7,027,535 B1
(45) Date of Patent: Apr. 11, 2006

(54) FREQUENCY TRACKING LOOP AND METHOD OF FREQUENCY TRACKING

(75) Inventor: Andrew John Aftelak, Basingstoke (GB)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/913,418

(22) PCT Filed: Feb. 25, 2000

(86) PCT No.: PCT/EP00/01734

§ 371 (c)(1),
(2), (4) Date: Aug. 13, 2001

(87) PCT Pub. No.: WO00/51237

PCT Pub. Date: Aug. 31, 2000

(30) Foreign Application Priority Data

Feb. 26, 1999 (GB) .................................. 9904437

(51) Int. Cl.
H04L 27/06 (2006.01)

(52) U.S. Cl. ..................... 375/344; 455/266

(58) Field of Classification Search ................ 375/344, 375/326, 327; 342/99; 455/99, 351, 182.1, 455/182.2, 192.1, 192.2, 255, 258, 259, 260, 455/266

See application file for complete search history.

(56) References Cited

U.S. PATENT DOCUMENTS

| | | | | |
|---|---|---|---|---|
| 4,106,102 A | * | 8/1978 | Desblache | 708/310 |
| 4,348,772 A | * | 9/1982 | Leland et al. | 455/260 |
| 4,691,176 A | * | 9/1987 | Hsiung et al. | 331/2 |
| 4,961,206 A | * | 10/1990 | Tomlinson et al. | 375/261 |
| 5,331,299 A | * | 7/1994 | Smith | 333/175 |
| 5,513,221 A | * | 4/1996 | Parr et al. | 375/344 |
| 5,822,373 A | * | 10/1998 | Addy | 375/259 |
| 5,894,592 A | * | 4/1999 | Brueske et al. | 455/86 |
| 6,226,336 B1 | * | 5/2001 | Atarius et al. | 375/364 |
| 6,324,228 B1 | * | 11/2001 | Millward et al. | 375/344 |
| 6,476,681 B1 | * | 11/2002 | Kirkpatrick | 331/17 |
| 6,650,715 B1 | * | 11/2003 | Kim et al. | 375/344 |
| 2001/0055348 A1 | * | 12/2001 | Anderson et al. | 375/324 |

OTHER PUBLICATIONS

M. Swahashi and K. Murota, Variable-Bandwidth Filter Using SCF and MOSFET-C Filter, ISCAS '89, May 8-11, 1989, 1989 IEEE International Symposium on Circuits and Systems, vol. 2, pp. 1455-1458.*

* cited by examiner

Primary Examiner—Betsy L. Deppe
(74) Attorney, Agent, or Firm—Steven R. Santema; Valerie M. Davis

(57) ABSTRACT

A frequency tracking loop (100) includes: a mixer (122) for correcting frequency offset of an input radio signal that includes bursts of known data; a frequency offset estimator (134), for providing an estimate of frequency offset; a variable bandwidth filter (142), for providing a filtered signal; an oscillator (146) for supplying a second input of the mixer with a signal whose frequency depends on the filtered signal; the frequency tracking loop (100) is adapted to change the bandwidth of the variable bandwidth filter (142) in dependence on at least one characteristic of the currently received burst of known data.

12 Claims, 2 Drawing Sheets

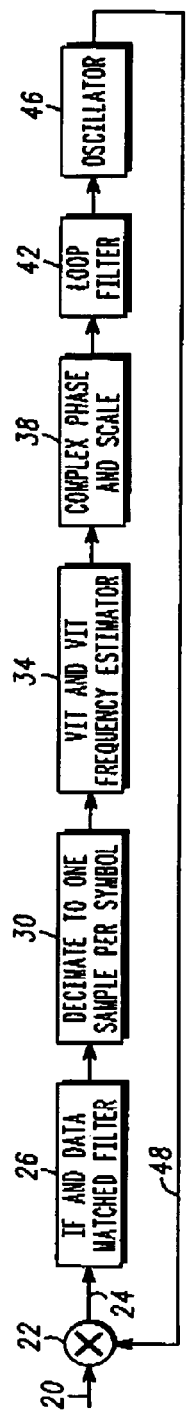
FIG. 1 —PRIOR ART—
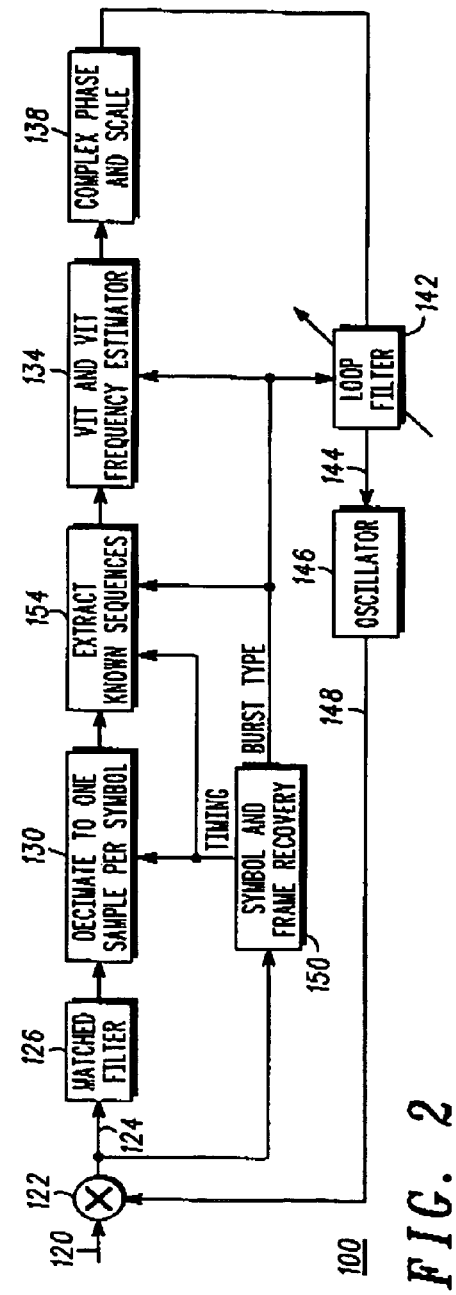
FIG. 2

FREQUENCY TRACKING LOOP AND METHOD OF FREQUENCY TRACKING

TECHNICAL FIELD

The present invention relates to the field of radio communication systems. Particularly, but not exclusively, this invention relates to radio receivers for mobile digital radio communication systems.

BACKGROUND

Mobile radio communications systems generally comprise a number of mobile or portable radio units. The radio units in a public- or private mobile radio communications system are often referred to as 'mobile stations'. The radio communication system's infrastructure comprises fixed nodes, termed 'base stations', through which mobile stations can communicate.

Normally, a mobile station is within communication range of a base station. In this case, the mobile station will communicate through the base station, this mode of operation typically being termed 'trunked mode'. However, some mobile radio communication systems allow an individual mobile station to set up a direct radio link to another mobile station, without the communication link passing through the infrastructure of the communication system. This form of communication between two mobile stations is referred to as 'direct mode' operation.

Mobile stations operating in direct mode have to receive radio signals that typically show greater variation in their parameters than radio signals received from the infrastructure of the communications system. This is because of differences in the signals transmitted from a mobile station in comparison to those from a base station of the infrastructure. As an example, the lower quality clock of a mobile station may cause greater variation in the carrier frequency of the signal broadcast by the mobile station in comparison to that from a base station.

The information carried by any digital communications system can only be recovered after the receiver has first synchronised to the received signal. The high frequency signal reaching the receiver will be at a frequency that depends on the frequency of an oscillator in the transmitter. A further oscillator in the receiver is used to down-convert the high frequency received signal. Because the oscillators in the transmitter and the receiver do not work at precisely the same frequency, the down-converted signal in the receiver has a slightly different frequency than that which would arise if the two oscillators had identical frequencies. This mismatch is part of the reason why a synchronisation circuit is needed in the receiver, to 'compensate' for the down-converted signal not having its ideal, theoretical frequency value. The mismatch will typically vary with time.

Thus there is a need in a mobile digital radio system for synchronisation in the radio receiver. The state where synchronisation between the receiver and the received signal has been attained is often referred to simply as 'lock'. The need for accurate synchronisation is particularly great for direct mode operation of mobile stations, because of the greater variation in the parameters of the received radio signals. This applies both to:
(i) achieving synchronisation when a call is first set up; and
(ii) maintaining synchronisation during a call.

In the Terrestrial Trunked radio system (TETRA), direct mode operation is permitted. A direct mode call is set up by sending two frames (8 slots) of synchronisation bursts, which last for 113 msec. In terms of the requirements on the automatic frequency correction (AFC) algorithm in the receiving radio, the radio needs to synchronise to these bursts, in order to start decoding data as quickly as possible. After synchronisation at call set up, the receiver must then maintain synchronisation for the duration of the call. This requires the receiver to follow variations in the frequency of the received signal. This action of following is often referred to as 'tracking'. The part of the receiver which carries this out is the 'tracking loop'.

The synchronisation bursts are an example of a 'training sequence'. A 'training sequence' is a sequence of symbols in a communications signal which are known to both the transmitter and the receiver.

FIG. 1 shows a prior art arrangement of a frequency tracking loop 10. This is a 'feedback' tracking loop. FIG. 1 shows a generalised arrangement in order to explain the principle of operation of a frequency tracking loop.

Briefly, the elements shown in FIG. 1 are:
(i) A mixer 22. One input to the mixer, element 20, provides the radio signal received by the receiver, which may have been 'down-converted' to intermediate frequency. This down-converted signal is the 'input' to the frequency tracking loop. The oscillator used to down-convert the received high frequency signal to intermediate frequency is not shown in FIG. 1. It is however this oscillator which is partly responsible for frequency variations in the input signal. The output of the mixer is provided on output 24.
(ii) A 'data matched' filter 26. The filter is matched to the pulse shape of the received signal. This means that it is designed to filter pulses of the shape transmitted by the transmitter of the radio system.
(iii) A decimation circuit 30. The decimation circuit 30 reduces the number of samples supplied to it from the filter 26. Decimation circuit 30 reduces the number of samples to one per received pulse. This is enough to identify each received pulse.
(iv) A Viterbi & Viterbi Frequency estimator 34. This is a known circuit element, which implements a known method of measuring frequency offset. Estimator 34 uses the training sequences in making the estimate of frequency offset. Other prior art arrangements are however known which do not rely on the training sequences to achieve this.
(v) A complex phase determining and scaling circuit 38.
(vi) A loop filter 42.
(vii) An oscillator 46. The output of oscillator 46 is fed back on output 48 to provide the second input to mixer 22.

The purpose of the circuit shown in FIG. 1 is to 'track' variations in the frequency of the input signal. Elements (ii)–(vi) drive oscillator 46 to generate a signal which matches the frequency of the input signal. As there is a time delay in the oscillator generating a signal that has the same frequency as the input to the frequency tracking loop, the 'following' action provided by the whole frequency tracking loop is not instantaneous.

In operation of the feedback tracking loop, the frequency estimator 34 and phase and scaling block 38 give an estimate of the frequency offset from the current input. This estimate will be noisy.

The noisy estimates are passed through the loop filter 42, which reduces the noise and defines the transient response of the frequency tracking loop 10.

The bandwidth chosen for the loop filter 42 is a compromise between two requirements. One of these is the requirement to reject noise. This dictates that the loop filter 42 have a narrow bandwidth. The other requirement is that the frequency tracking loop 10 be able to track a changing input frequency. This dictates that the loop filter 42 have a wide bandwidth. Clearly these requirements set conflicting conditions on the loop filter 42.

Frequency tracking loops of the prior art are known, which switch the bandwidth of the tracking filter during acquisition of a signal. A wide bandwidth is used to acquire the signal, and the bandwidth of the loop filter is narrowed during tracking.

Frequency tracking loops are also known in the prior art which adapt the loop filter bandwidth in dependence on the size of the estimate of frequency. However, adaptation of the loop is based on the measurement of the error between the currently received and currently generated frequencies. This measurement itself may be in error and can lead to an adaptation that suppresses the wanted signal.

A need exists to alleviate problems of the arrangements known from the prior art. One particular problem addressed by the present invention is to provide optimum frequency tracking in a feedback tracking loop.

SUMMARY OF THE INVENTION

The invention comprises a frequency tracking loop for a digital radio communications system. The frequency tracking loop comprises:

(i) a means for correcting frequency offset, the means for correcting frequency offset receiving an input radio signal comprising bursts of known data at a first input, and supplying an output signal;

(ii) a frequency offset estimator, supplied with the output signal from the means for correcting frequency offset, for providing an estimate of the frequency offset of the output signal;

(iii) a variable bandwidth filter, supplied with the estimate of the frequency offset from the frequency offset estimator, for providing a filtered signal;

(iv) a signal generating means, supplied with the filtered signal from the variable bandwidth filter, for generating an output signal with a frequency dependent on the filtered signal, the output signal from the signal generating means being supplied to a second input of the means for correcting frequency offset, wherein the frequency tracking loop is adapted to change the bandwidth of the variable bandwidth filter in dependence on at least one characteristic of the currently received burst of known data.

The frequency tracking loop may be adapted to change the bandwidth of the variable bandwidth filter in dependence on the length of the currently received burst of known data.

The invention also extends to a digital radio communications receiver which comprises a frequency tracking loop in accordance with the invention, and a mobile- or a portable radio, or a mobile telephone, comprising such a receiver.

The invention also comprises a method of frequency tracking for a digital radio communications system. The method of frequency tracking comprises:

(i) in a means for correcting frequency offset, receiving an input radio signal comprising bursts of known data;

(ii) estimating the frequency offset of the output signal from the means for correcting frequency offset, to provide an estimate of frequency offset;

(iii) filtering the estimate of frequency offset with a variable filtering bandwidth, to provide a filtered signal;

(iv) generating a signal having a frequency dependent on the filtered signal, to provide a generated signal;

(v) correcting the frequency of the input radio signal in the means for correcting frequency offset, using the generated signal;

wherein the variable filtering bandwidth depends on at least one characteristic of the currently received burst of known data.

The method of frequency tracking may further comprise changing the bandwidth of the variable bandwidth filtering in dependence on the length of the currently received burst of known data.

The invention provides an adaptive frequency tracking loop and method of frequency tracking, which have optimised frequency tracking. This tracking provides rapid and precise automatic frequency control within the feedback tracking loop in response to changes in the input frequency to the loop. The adaptive loop has better performance than conventional techniques. The frequency tracking loop has a better chance than prior art circuits of maintaining lock when the signal level is low.

The invention is particularly advantageous for a digital radio communications receiver operating in direct mode.

BRIEF DESCRIPTION OF THE DRAWINGS

FIG. 1 illustrates a prior art frequency tracking loop.

FIG. 2 illustrates in detail one embodiment of a frequency tracking loop in accordance with the invention.

DETAILED DESCRIPTION OF THE PREFERRED EMBODIMENT

Figure 3:
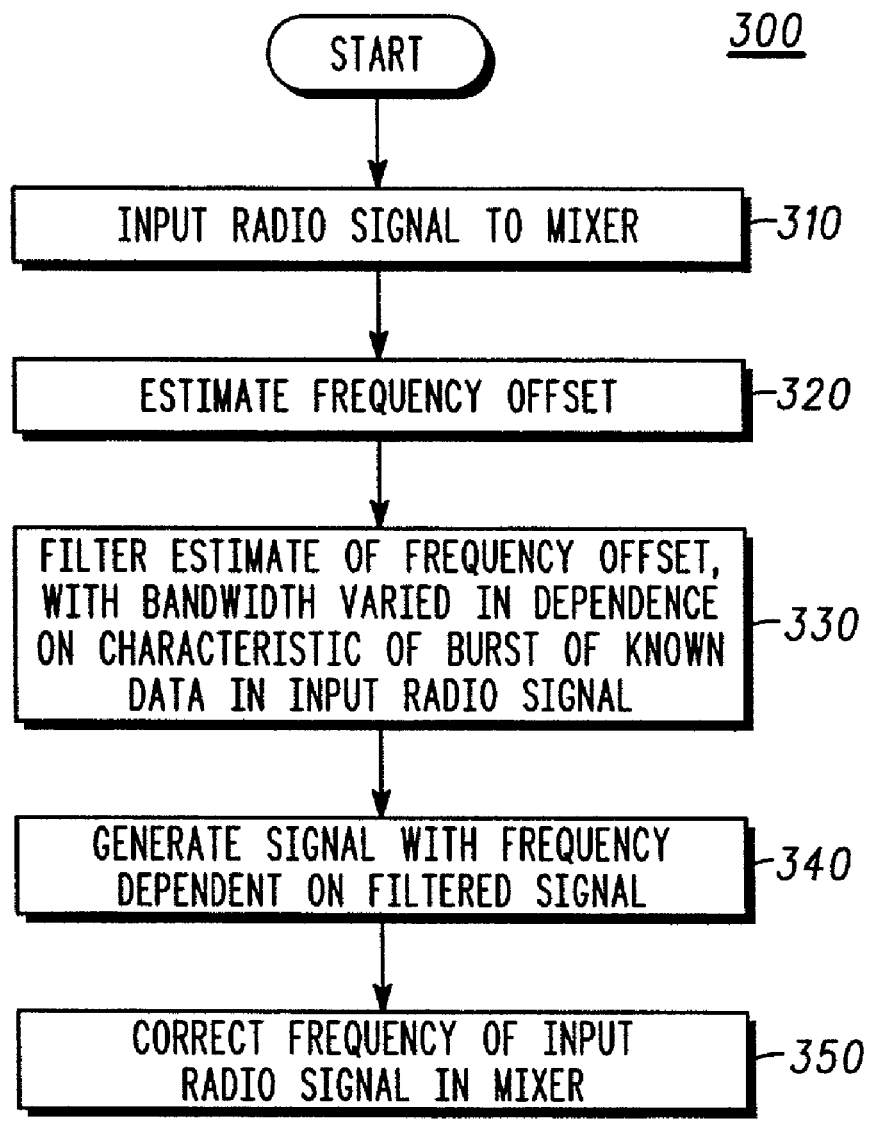
FIG. 3 illustrates one embodiment of a method of frequency tracking in accordance with the invention, in the form of a flow chart.

FIG. 2 illustrates one embodiment of a frequency tracking loop in accordance with the invention. The frequency tracking loop of FIG. 2 is an adaptive loop.

The circuit of FIG. 2 is a frequency tracking loop 100 for a digital radio communications system. The input to the frequency tracking loop is a received radio signal. The signal input to the frequency tracking loop may have been converted into an intermediate frequency signal and then to base-band prior to reaching frequency tracking loop 100. Alternatively, the input signal may have been directly converted from high frequency down to base-band in a direct converter. The input radio signal comprises bursts of known data. In a TETRA or GSM signal, these bursts of known data are the training sequences.

The received radio signal is supplied to the first input 120 of a mixer 122 in the embodiment of FIG. 2. However, other means for correcting frequency offset, such as for example a complex multiplier, could be used here. Mixer 122 supplies an output signal on output 124.

The signal on output 124 is fed to matched filter 126, and then to a decimation circuit 130.

After decimation, the signal may be fed to circuit element 154. Element 154 serves to extract the training sequences from the signal. These training sequences are used by element 134, a Viterbi & Viterbi Frequency estimator. Frequency estimator 134 provides an estimate of the frequency offset of the output signal from the mixer. An element corresponding to element 154 may also be used in the prior art arrangement of FIG. 1, but was not shown there for reasons of clarity of illustration.

The estimate of the frequency offset is fed to a complex phase and scale circuit 138, and then to a variable bandwidth filter 142. The variable bandwidth filter 142 provides a filtered signal on output 144.

The filtered signal on output 144 is fed to an oscillator 146. Typically, oscillator 146 is a voltage controlled oscillator. However, any signal generating means that is suitable for generating an output signal with a frequency that depends on the filtered signal could be used here.

The output signal from oscillator 146 is supplied to a second input 148 of the mixer 122. This enables mixer 122 to correct the frequency of the input signal on input 120.

The frequency tracking loop of the invention is adapted to change the bandwidth of the variable bandwidth filter 142 in dependence on at least one characteristic of the currently received burst of known data. In accordance with the invention, the frequency tracking loop automatically adapts the bandwidth of the loop filter 142. Therefore the frequency tracking loop is 'adaptive'.

In the particular arrangement shown in FIG. 2, means 150 provide symbol and frame timing information to the whole frequency tracking loop 100. In accordance with the invention, means 150 determines the type of burst of known data received in a slot of the input radio signal. Means 150 can then supply a signal to the variable bandwidth filter 142 identifying the type of burst of known data. The type of burst indicates how many a priori known data symbols are contained within the burst. This information allows adjustment of the bandwidth of the variable bandwidth loop filter on the basis of the length of known data within the received burst.

The effect of varying the bandwidth of variable bandwidth filter 142 in accordance with the invention can be understood by considering the operation of frequency estimator 134. As explained in connection with FIG. 1, the frequency estimator 34, 134 in the frequency tracking loop derives an estimate of the frequency of the signal output by the mixer. The frequency estimator 134 in the arrangement of FIG. 2 uses the training sequences to make this estimate.

The signal to noise ratio of the frequency estimate provided by frequency estimator 134 is approximately proportional to the number of known symbols used to derive the estimate. Therefore the bandwidth of the variable bandwidth loop filter can be optimised to the signal to noise ratio of the output signal from the frequency estimator 134 by changing the bandwidth in dependence on the number of symbols in the received known data sequence. As explained in detail below, the TETRA and GSM systems use training sequences whose type indicates the number of symbols which they contain.

Various detailed arrangements of the invention satisfy the underlying principle of the invention. The invention may be arranged with a frequency tracking loop that is adapted to provide a variable bandwidth filter with a relatively wide bandwidth on receiving a long burst of known data, and a relatively narrow bandwidth on receiving a short burst of known data. The bandwidth may be made proportional to the length of the currently received burst of known data.

The function of circuit element 150 is now considered. A receiver of digital data normally has circuitry for recovering the symbols and frames of the received signal. This circuitry provides symbol and frame timing information to the receiver. In fact, the training sequences in the received signal are normally used to facilitate this recovery. Typically, the bits of the known training sequence are compared in a correlator with each successive group of bits of the received radio signal. When the correlation is a maximum, this indicates that the group of bits of the received signal corresponds to the training sequence. Since the receiver knows where in a frame of data the training sequences are located, this correlation technique provides the required information about the start and finish of the frame, and hence the frame timing. In making the correlation determination, the correlator clearly also identifies which type of training sequence is contained in the received radio signal. Therefore element 150 can provide both information about the timing of the training sequences to element 134 in FIG. 2, and information about the specific type of training sequence received to variable bandwidth filter 142.

Although FIG. 2 shows a specific arrangement for implementing the teaching of the present invention, the invention is of wider scope than this single embodiment. In the arrangement shown in FIG. 2, means 150 supplies information about the type of burst to the loop filter 142. However, means 150 may simply determine the number of symbols making up the burst of known data. Means 150 could then supply this information to the variable bandwidth filter 142. Alternatively, means 150 could supply a control signal to the variable bandwidth filter, setting the bandwidth of the filter in dependence on the number of known symbols contained within the burst. The number of symbols and their location is defined by the type of burst, which is determined by identifying the training sequence.

GSM and TETRA radio systems are now considered, in order to provide a numerical example of a practical implementation of the invention. Both GSM mobile telephone systems and TETRA radio systems employ training sequences. Motorola's TETRA compliant radio system is the 'Dimetra' system. When Dimetra subscribers operate in direct mode, the automatic frequency control loop derives its estimate of frequency offset from the training sequences in the received bursts.

TETRA direct mode communication uses two types of training sequence, i.e. bursts of known data, during a call. These are the 'synchronisation burst' (DSB) and the 'normal burst' (DNB).

For the DSB burst, the known training sequences are a 6 symbol preamble, a 19 symbol training sequence and a 40 symbol frequency correction sequence. The data burst therefore comprises a total of 65 symbols.

For the DNB burst, the known training sequences are a 6 symbol preamble and an 11 symbol training sequence. The data burst therefore comprises a total of 17 symbols.

Therefore we can expect estimates derived from the DSB bursts to have an average signal to noise ratio 65/17 times better than the estimates derived from the DNB bursts.

In the particular example of a TETRA system, the inventive frequency tracking loop can adjust the bandwidth of the loop filter in dependence on whether either a DSB or a DNB has been received.

When a DSB has been received, the loop bandwidth can be made wider than for a DNB, for example 65/17 times wider. The noise performance of the loop will not suffer significantly, but its ability to track changing frequencies will be enhanced.

The arrangement of the invention is valid for other lengths of data burst than the example of DSB and DNB data bursts explained here.

This example provided a bandwidth for the variable frequency filter which was 65/17 times wider in the case of a DSB burst than a DNB burst. However, the invention extends to other tracking loops, particularly those with a filter bandwidth for a larger burst that is greater then the bandwidth for a smaller burst by a factor equal to the ratio of the number of symbols in two different types of known data burst.

The frequency tracking loop may advantageously be used in a receiver for a digital radio communications system. The receiver incorporating the frequency tracking loop of the invention may be employed in a mobile- or a portable radio, or a mobile telephone.

FIG. 3 shows a method of frequency tracking in accordance with the invention, in the form of a flow-chart 300.

The method of frequency tracking of FIG. 3 for a digital radio communications system comprises steps 310–350.

In step 310, a means for correcting frequency offset receives an input radio signal comprising bursts of known data. These bursts of known data are typically the TETRA training sequences explained above. The means for correcting frequency offset may comprise, for example, a mixer or a complex multiplier.

Step 320 of the method comprises estimating the frequency offset of the output signal from the means for correcting frequency offset. This step provides an estimate of frequency offset of the received radio signal.

In step 330, the estimate of frequency offset is filtered with a variable filtering bandwidth, to provide a filtered signal. The variable filtering bandwidth used depends on at least one characteristic of the currently received burst of known data.

Step 340 comprises generating a signal having a frequency dependent on the filtered signal from step 330, to provide a generated signal. Typically, an oscillator may generate this signal.

Step 350 comprises correcting the frequency of the input radio signal in the means for correcting frequency offset, using the signal generated in step 340.

Although step 350 is shown separately from step 310 in FIG. 3, these steps are both performed in the mixer. See element 122 of FIG. 2. Once a first estimate of the frequency offset has been found therefore, step 350 can be considered to link back into step 310. This is not illustrated in FIG. 3 for simplicity.

In further preferred embodiments of the method of the invention, step 330 may further comprise changing the bandwidth of the variable bandwidth filtering in dependence on the length of the currently received burst of known data. The change of bandwidth may be such as to provide variable bandwidth filtering with a relatively wide bandwidth on receiving a long burst of known data, and providing variable bandwidth filtering with a relatively narrow bandwidth on receiving a short burst of known data. The bandwidth of the variable bandwidth filter may be made proportional to the length of the currently received burst of known data.

The frequency tracking loops and methods of the prior art do not make use of the expected signal to noise ratio of the individual estimates of frequency offset, based upon the type of input data burst, to adapt the bandwidth of the loop filter. Thus these prior art arrangements do not have the advantage of the invention, that the tracking performance is improved without impacting on robustness to noise.

The invention claimed is:

1. A frequency tracking loop for a digital radio communications system, said frequency tracking loop comprising:
   (i) a means for correcting frequency offset, said means for correcting frequency offset receiving an input radio signal comprising bursts of known data at a first input, and supplying an output signal;
   (ii) a frequency offset estimator, supplied with said output signal from said means for correcting frequency offset, for providing an estimate of a frequency offset of said output signal;
   (iii) a variable bandwidth filter, supplied with said estimate of the frequency offset from said frequency offset estimator, for providing a filtered signal;
   (iv) a signal generator, supplied with said filtered signal from said variable bandwidth filter, for generating an output signal with a frequency dependent on said filtered signal, said output signal from said signal generator being supplied to a second input of said means for correcting frequency offset,
wherein said frequency tracking loop is adapted to change a bandwidth of said variable bandwidth filter in dependence on at least one characteristic of a currently received burst of known data and wherein said frequency tracking loop is further adapted to provide said variable bandwidth filter with a wide bandwidth on receiving a burst of known data having a first length, and to provide said variable bandwidth filter with a narrow bandwidth on receiving a burst of known data having a second length that is shorter than the first length.

2. A frequency tracking loop in accordance with claim 1, wherein said means for correcting frequency offset comprise a mixer or a complex multiplier, and said signal generator comprises an oscillator.

3. A frequency tracking loop in accordance with claim 1, wherein said frequency tracking loop is adapted to change said bandwidth of said variable bandwidth filter in dependence on a length of said currently received burst or known data.

4. A frequency tracking loop in accordance with claim 1, wherein said frequency tracking loop is adapted to provide said variable bandwidth filter with a bandwidth proportional to a length of said currently received burst of known data.

5. A frequency tracking loop in accordance with claim 1, wherein said bursts of known data comprise one or more synchronisation bursts and one or more normal bursts, said frequency tracking loop being adapted to provide said variable bandwidth filter with a larger bandwidth for a synchronisation burst than for a normal burst, said bandwidth for said synchronisation burst being larger than that for said normal burst by a factor equal to a ratio of a number of symbols in said synchronisation and normal bursts.

6. A frequency tracking loop in accordance with claim 1, further comprising means for:
   (i) determining a type of burst of known data received in a slot of an input radio signal; and
   (ii) supplying a signal to said variable bandwidth filter identifying said type of burst of known data.

7. A frequency tracking loop in accordance with claim 1, further comprising means for:
   (i) determining a type of burst of known data and a number of symbols making up said burst of known data; and
   (ii) supplying a control signal to said variable bandwidth filter setting said bandwidth of said filter in dependence on said number of symbols.

8. A receiver for a digital radio communications system, said receiver comprising a frequency tracking loop in accordance with claim 1.

9. A mobile- or a portable radio, or a mobile telephone, comprising a receiver in accordance with claim 8.

10. A method of frequency tracking for a digital radio communications system, said method of frequency tracking comprising:

(i) in a means for correcting frequency offset, receiving an input radio signal comprising bursts of known data;
(ii) estimating said frequency offset of said output signal from said means for correcting frequency offset, to provide an estimate of frequency offset;
(iii) filtering said estimate of frequency offset with a variable filtering bandwidth, to provide a filtered signal;
(iv) generating a signal having a frequency dependent on said filtered signal, to provide a generated signal;
(v) correcting said frequency of said input radio signal in said means for correcting frequency offset, using said generated signal;
wherein said variable filtering bandwidth depends on at least one characteristic of a currently received burst of known data, wherein variable bandwidth filtering with a wide bandwidth is provided on receiving a burst of known data having a first length, and variable bandwidth filtering with a narrow bandwidth is provided on receiving a burst of known data having a second length that is shorter than the first length.

11. A method of frequency tracking in accordance with claim 10, further comprising changing a bandwidth of said variable bandwidth filtering in dependence on a length of said currently received burst of known data.

12. A method of frequency tracking in accordance with claim 10, further comprising providing said variable bandwidth filter with a bandwidth proportional to a length of said currently received burst of known data.

* * * * *